Nov. 28, 1967 R. LAWRENCE ET AL 3,354,543

METHOD OF FORMING HOLES THROUGH CIRCUIT BOARDS

Filed June 9, 1965 2 Sheets-Sheet 1

INVENTORS
ROBERT LAWRENCE
JOHN N. LEONARD
ROBERT C. WILLIAMS
BY Arthur Freilich
ATTORNEY INVENTORS
ROBERT LAWRENCE
JOHN N. LEONARD
ROBERT C. WILLIAMS
BY
Arthur Frailich
ATTORNEY United States Patent Office 3,354,543

Patented Nov. 28, 1967

3,354,543
METHOD OF FORMING HOLES THROUGH CIRCUIT BOARDS

Robert Lawrence, Encino, and John N. Leonard, Northridge, Los Angeles, and Robert C. Williams, Santa Susana, Calif., assignors to The Bunker-Ramo Corporation, Stamford, Conn., a corporation of Delaware Filed June 9, 1965, Ser. No. 462,553
13 Claims. (Cl. 29—625)

ABSTRACT OF THE DISCLOSURE

A method of chemically etching a circuit board comprised of an insulative substrate having conductive coatings on opposite surfaces thereof to form holes therein having a reduced undercut. The method involves removing a portion of the conductive coating to expose the insulative substrate. Thereafter, the circuit board is alternately exposed to an etching solution and to sufficient forces, e.g. vapor blast, to simultaneously remove dissolved substrate material and to bend the conductive coating into the void left by the dissolved material.

Figures 1A, 1B, 1C, 1D, 1E, 1F, 1G, 1H, 1I, 2A, 2B, 2C, 2D, 2E:
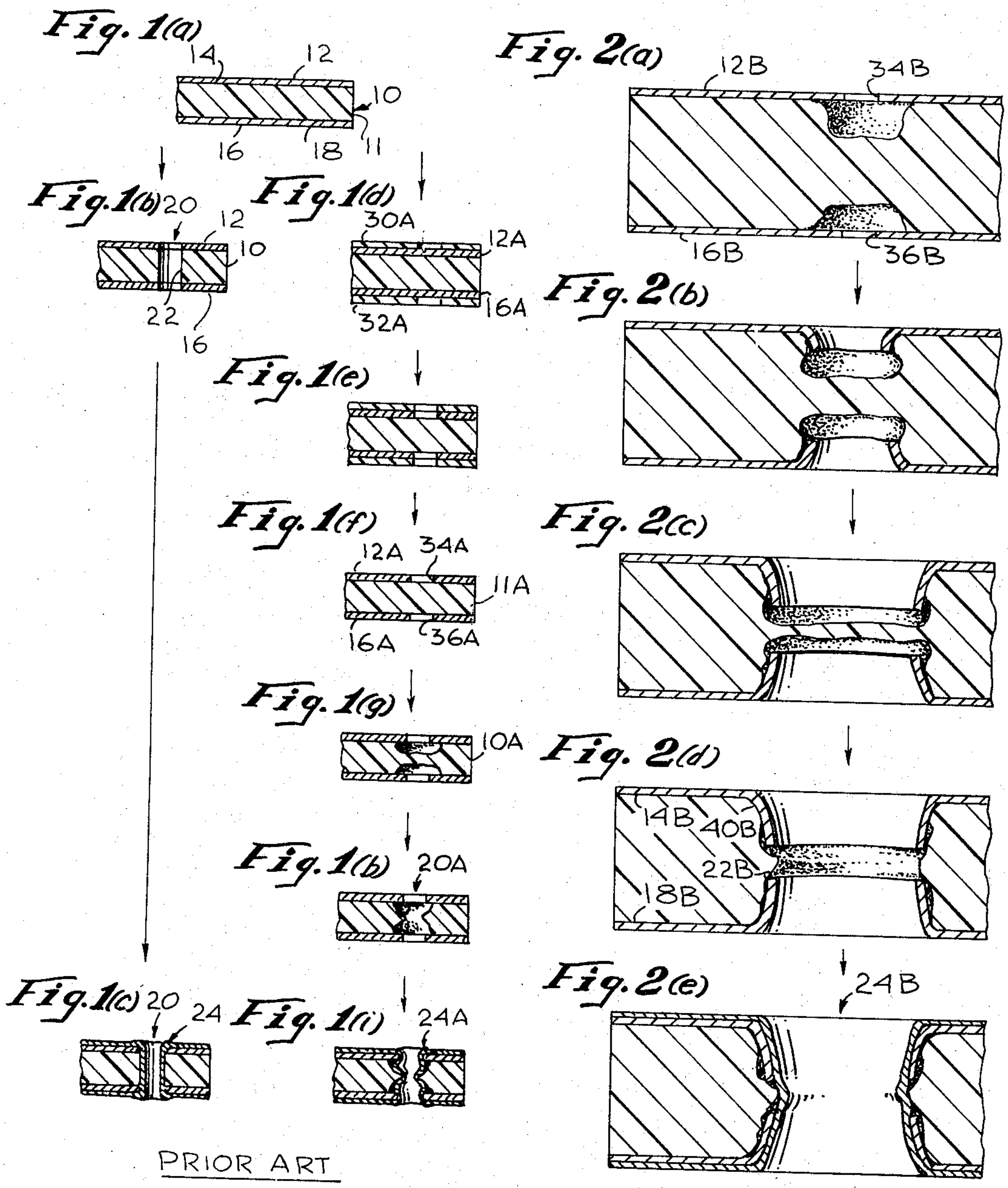

This invention relates generally to electrical and/or electronic circuit constructions and to fabrication methods therefor.

Printed circuit and/or printed wiring boards, of single or multilayer constructions, are now in widespread use in many electronic equipments for carrying active and passive electrical circuit components and structural interconnecting conductors. The base or substrate of such boards is usually formed of one or more flat laminations which are made of some insulative material such as an epoxy with plastic or Fiberglas filler materials. Flat copper conductors are usually formed on one or both surfaces of the circuit board substrate by any one of several different techniques for the purpose of, for example, interconnecting circuit components and providing means for connecting such components with other electrical circuitry, which in turn may be held by another circuit board.

Normally, it is desirable to selectively form holes, recesses, cutouts, contours, etc. (all of which will hereinafter be generically referred to as "holes") in the conductors held on the circuit board base as well as in the board substrate itself for various reasons as, for example, for receiving electrical circuit components or the leads of such components. In the case of double clad circuit boards, that is, circuit boards where conductive material is affixed to both surfaces of the board substrate, such holes provide means for also permitting interconnections to be made between conductors and components disposed on opposite board surfaces. Where such holes are to be used for accepting the leads of components or interconnecting components on opposite sides of the board, it is the practice through chemical and electrochemical deposition to apply a thin layer of copper (or other conductive material to which solder readily adheres) to the walls of such holes so as to improve the mechanical bond between any component lead and the substrate when solder is applied within the hole, as well as provide a conductive path between the two surfaces of the board where such is required.

Various techniques are known for forming holes in circuit boards, amongst which are both standard mechanical fabrication techniques and chemical etching techniques. Standard mechanical fabrication techniques, such as punching, drilling, routing, milling, etc., are slow and costly where many different size and shape holes must be provided in very large numbers. As a consequence of these drawbacks, much effort has been expended in the development of chemical etching techniques where inexpensive chemicals, commercially obtainable in large volume quantities, may be used to chemically "mill" or selectively dissolved both the conductors and the board base material itself to form holes either partially or fully through the board.

In chemically etching a hole through double clad printed circuit boards, the approach generally used is to first selectively etch away the copper or other conductive material at locations defining the outer termini of the hole and then etch away or dissolve the circuit board base or substrate between these termini. In the first step, an etchant is used which rapidly attacks the conductive material while generally having little or no effect on the board substrate material. During the second step, an etchant is used which in turn rapidly attacks the materials forming the substrate but has little or no effect on the conductive material.

The primary drawback of chemical etching techniques known prior to the present invention is that they do not permit the formation of satisfactory small diameter holes through relatively thick substrate materials, the walls of which holes are in turn susceptible of being plated with a conductive metal to form an internal structure having good electrical and mechanical properties. This is because of the tendency of the substrate etchant to both undercut the copper surface and modify the properties of the substrate forming the walls of the holes; that is, since the etchant acts omnidirectionally, it will dissolve substrate material in a direction parallel to the conductive layers on the board surfaces substantially as fast as it will in a direction perpendicular to such layers. Thus, it has been very difficult to create holes through the board whose diameter along the entire cross section of the hole is significantly less than the board thickness. Moreover, excessive undercut considerably damages the structural characteristics of the board substrate in that it causes the substrate material forming the walls of the holes to be come spongy and less suportive of the film of copper plated on the hole walls prior to soldering component leads within the hole.

In accordance with a first aspect of the present invention, a method of chemically etching circuit boards is provided in which undercut is minimized by periodically applying a sufficient force to the copper, during or alternately with the etching procedure, to form by peening, coining or bending the copper into the hole being created to thereafter protect portions of the hole wall from the etchant and to overwise act to control the direction in which the etching proceeds.

In accordance with a preferred method of practicing the invention, a circuit board is initially placed in an appropriate etchant to dissolve some of the exposed substrate material. It is then subjected to a vapor blast to clean out the dissolved material and to form the copper into the thus far etched hole. These operations can be repetitively performed to achieve the size of hole desired.

A feature of the invention is that the utilization of the disclosed method causes a substantially hourglass shaped hole to be formed in the board, which shape has considerable advantages over straight-wall holes created by mechanical fabrication techniques.

More particularly, the funnel or trough-shaped portions of the hourglass-shaped hole permit easy entry of component leads and provide an exceptionally good interlock for the subsequent deposition of solder or such. Moreover, by forming the copper material into the hole, the possibility of an open circuit occurring between the conductive material on the substrate surface and the hole wall becomes considerably more remote than it would otherwise be.

In accordance with a further aspect of the present invention, in order to permit very small holes to be etched, a "wetting" agent is incorporated in the etchant. Incorporation of the "wetting" agent reduces the surface tension of the etchant and permits smaller openings than are otherwise possible to be defined in the etchant resistant copper while still assuring intimate contact between the etchant and the portion of the board to be etched.

In accordance with a still further aspect of the present invention, an improved etchant is provided comprising a fluoride salt or acid and containing ammonium bifluoride, for example. It is recognized herein that such an acid is extremely effective for etching glass materials such as Fiberglas mats or glass woven cloths often used with epoxy.

It is additionally recognized herein that, regardless of whether copper layers exist on the substrate, the method steps disclosed are useful for forming holes in substrates. More particularly, in order to form holes in epoxy-plastic or epoxy-glass substrates, sulphuric acid or an equivalent can be applied to attack the epoxy, and then the exposed plastic or glass together with the softened epoxy can be removed by the flow from a vapor blast machine.

Figures 3A, 3B, 3C:
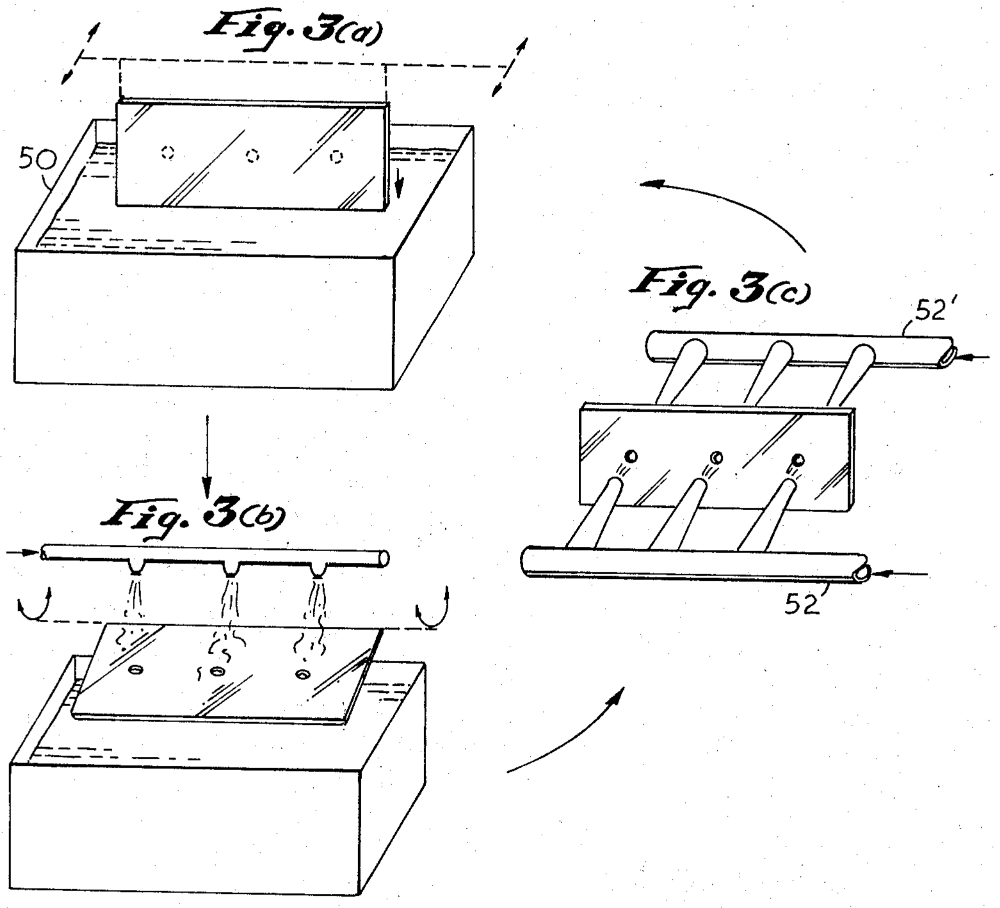
Figure 4:
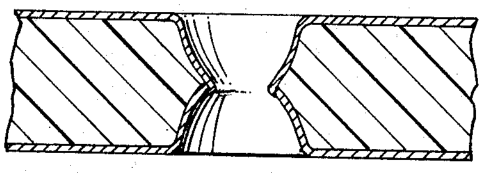

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

FIGURE 1(*a*) is a sectional view of a circuit board having conductive material, such as copper, deposited on both surfaces thereof;

FIGS. 1(*b*) and 1(*c*) are sectional views of a circuit board illustrating how a plated-through hole can be formed therein by mechanical fabrication techniques of the prior art;

FIGS. 1(*d*) through 1(*i*) are sectional views illustrating how a plated-through hole can be formed in a circuit board utilizing chemical etching techniques of the prior art;

FIGS. 2(*a*) through 2(*e*) are sectional views illustrating how a plated-through hole can be formed in a circuit board in accordance with the teachings of the present invention;

FIG. 3 is a diagrammatic representation of steps employed in a preferred method of practicing the present invention; and FIG. 4 is a sectional view illustrating a circuit board having a hole therein in which copper projections extending from opposite substrate surfaces electrically contact one another.

Attention is now called to the drawings and, more particularly to FIG. 1, which illustrates two substantially conventional techniques for forming holes in circuit boards. It has been pointed out that such holes are formed, for example, in order to receive a component lead, facilitate interconnection between two circuit boards, etc.

FIG. 1(*a*) shows a sectonal view of a typical circuit board 10 comprised of a substrate 11 having conductive material 12 on a first substrate surface 14 and conductive material 16 on a second substrate surface 18. Typically, the substrate 11 is comprised of alternate layers (not shown) of epoxy and some filler material such as plastic or a glass material. The dimensional thickness of the substrate 11 is not critical to the invention, but, for exemplary purposes, it will be assumed that the thickness is equal to 62 mils.

The conductive material 12 and 16 is usually copper and can be applied to the substrate 11 by various techniques well known in the art. Typically, the thickness of the copper is 1–3 mils.

FIG. 1(*b*) illustrates the board of FIG. 1(*a*) showing a hole 20 formed in the board 10 by conventional machining techniques such as by punching, drilling, or milling, etc. It is to be noted that the hole wall 22 thus formed is straight and substantially perpendicular to the surfaces 14 and 18.

In order to make the hole wall 22 conductive to make it suitable for receiving a component lead therein, it can be plated by conventional techniques. More particularly, an electroless plating chemical immersion technique can be employed to produce a thin metallic layer of copper on the portions of the substrate 10 constituting the hole wall 22. Thereafter, standard electroplating techniques can be used to build up the electroless copper throughout the hole. A sample which has initially been subjected to electroless copper plating and subsequently to an electroplating process is shown in FIG. 1(*c*). Therein it can be seen that the electroplating process usually causes an accumulation of copper material at the boundary of the copper layers 12 and 16 and the electroless plated copper at the edge 24 of the hole 20. This is attributable to the intensification of the electrical field at the sharp edges of the copper material in turn produced by the drilling process. As previously noted, utilization of standard machining techniques to form holes in circuit boards is a slow and relatively expensive procedure. As a consequence, efforts have been made to chemically "mill" or etch the circuit board, and such a technique is illustrated in FIGS. 1(*d*) through 1(*i*).

Typically, the outside surfaces of both copper layers 12A and 16A are cleaned by a standard vapor degreasing technique. Then a negative image is established on the copper layers 12A and 16A by standard photosensitive resist techniques. Thus, a resist material 30A is deposited on the copper layer 12A and a resist material 32A is deposited on the copper layer 16A. Resist materials 30A and 32A establish a negative image in that they leave, exposed, areas of the copper layers 12A and 16A which are unwanted. All of the other areas of the copper where holes are not desired are similarly covered. The sample shown in FIG. 1(*d*) is then subjected to a copper etching process which etches away the exposed portions of copper to form the sample shown in FIG. 1(*e*). The resist materials 30A and 32A can then be removed by standard techniques to thus arrive at the stage represented by FIG. 1(*f*); that is, the substrate 11 has not as yet been treated, but openings 34A and 36A have been formed in the copper layers 12A and 16A where the hole 20A is to be formed.

Subsequently, the sample of FIG. 1(*f*) is immersed and agitated in an etching solution which is capable of attacking the substrate 11A itself but incapable of affecting the copper layers 12A and 16A. Some such etching solutions are well known in the art. The etching solution will initially dissolve the substrate immediately beneath the openings 34A and 36A formed in the copper layers. Continued agitation will cause the substrate to continue to dissolve to the stage illustrated in FIG. 1(*h*). Inasmuch as the etchant works omnidirectionally, that is, equally as well in a direction parallel to the board surfaces as it does in a direction perpendicular to the board surfaces, the ultimate diameter of the hole 20 through the substrate adjacent its surfaces will be approximately equal to the thickness of the substrate. This makes it exceedingly difficult to chemically etch small holes, a smoll hole being defined as one whose diameter is considerably smaller than the thickness of the substrate.

Efforts have been made to make the openings 34A and 36A smaller than the diameter of the hole ultimately desired in order to minimize the contact area between the substrate and the etching solution. However, this has proved to be relatively ineffective and only serves to increase the undercut; that is, as shown in FIG. 1(*h*), if the opening in the copper layers 12A and 16A is smaller than the size of the hole ultimately desired, the etching solution will attack and dissolve substrate portions beneath the copper layers 12A and 16A, thereby considerably reducing the structural strength of the board inasmuch as no solid material supports either the copper layers adjacent the hole or the copper to be subsequently plated on the hole wall.

The hole 20A of FIG. 1(*h*) can then be initially plated electrolessly to provide a copper layer along the hole wall 22A and then can be electroplated to build up this copper layer. As noted hereinbefore, due to field intensification effects, the copper accumulates at the hole edges as shown at 24A. The edges therefore become exceedingly vulnerable in that component leads forced against these accumulations oftentimes break the accumulation away from the copper layers, thereby breaking the conductivity between the copper layers on the board surfaces and the copper on the hole wall.

The present invention is primarily directed to improve methods and materials for fabricating holes in circuit boards of the type described generally with respect to FIGS. 1(*b*) through 1(*i*) and, in addition, to an improved hole construction. The present invention is described with reference to FIGS. 2–4. FIG. 2(*a*) is an enlarged illustration of the substrate and copper layers shown in FIG. 1(*g*) after etching has begun. In accordance with the invention, instead of agitating the board in the etching solution until the solution eats completely through the substrate, the substrate is taken out of the etching solution at approximately the stage shown in FIG. 2(*a*) and then neutralized by, for example, running cold water over the board. Thereafter, a force, such as is available from a typical vapor blast machine (e.g., the Liquid Blast Cleaning Equipment manufactured by Pangborn Corporation, Hagerstown, Md., known as the No. 2 Type EZ-3 Hydrofinish Cabinet) is applied to both copper layers 12B, 16B, particularly adjacent the openings 34B, 36B. As shown in FIG. 2(*b*), the applied force cleans out the dissolved substrate material and, in addition, forms the copper adjacent the openings into the voids left by the dissolved material. After the copper layers have been bent as shown in FIG. 2(*b*), the board can again be agitated in the etching solution to dissolve more of the substrate material. Inasmuch as the copper layers are bent into the voids left by the dissolved material, and since they are driven up against the hole wall by the forces applied thereto, the copper layers protect the substrate portions therebeneath from being etched. Thus, the amount of undercut is considerably reduced over that which is encountered in the conventional chemical etching method shown in FIGS. 1(b) through 1(*i*). The board can then be subjected to another treatment by the vapor blast machine to further bend the copper adjacent the openings into the hole and against the hole wall as shown in FIG. 2(*c*). By subjecting the board to several of these cycles, each preferably comprised of etching, neutralizing, and blasting, the substrate material between the openings on the opposite sides of the substrate will ultimately get very thin, and the forces provided by the vapor blast machine will eventually remove this material, as shown in FIG. 1(*d*).

Several characteristics of the board shown at the stage of processing in FIG. 2(*d*) should be noted. Initially, it is significant to note that there is relatively little undercut inasmuch as the forces applied by the vapor blasting machine have forced the copper to bend and conform to the the rounded fillet 40B formed between the board surfaces 14B and 18B and the hole wall 22B. Not only does less undercut result from a hole formed in accordance with the present invention as distinguished from the chemical etching shown in FIG. 1, but a smaller hole can be formed, since the solution is somewhat inhibited, by the bent portions of the copper layers, from working in a lateral direction.

As a consequence of etching and cleaning out the hole with a vapor blast, the remaining hole wall will have reasonably good structural rigidity and can thereby provide a good base for supporting copper subsequently plated thereon by successive electroless and electroplating processes, as was previously mentioned with respect to FIGS. 1(*c*) and 1(*i*). It will be noted that the accumulation of copper resulting from the electroplating operation will still occur at the boundary between the deposited copper layers 12B, 16B and the electroless plated copper, but, however, this will no longer be at the edge of the hole on the surface of the board. Rather, the accumulation will occur at 24B effectively within the hole, where it is less vulnerable to being broken off. Accordingly, the reliability of a circuit board constructed in accordance with the present invention is considerably greater than that fabricated by previously known techniques.

Attention is now called to FIG. 3, which schematically illustrates the significant steps of a preferred method of practicing the present invention. The method will be described utilizing as a starting point the process stage represented by FIG. 1(*f*). An epoxy and glass substrate will be assumed. Initially, a given volume of etching solution is prepared by dissolving, preferably, 20 grams of ammonium bifluoride into 100 milliliters of sulphuric acid 66° Baumé. It has been found that ammonium bifluoride or other fluoride salts or acids are very effective for etching glass materials and not nearly as difficult to utilize as prior art glass etchants, such as hydrofluoric acid. As is well known, hydrofluoric acid is quite unstable and the fumes therefrom very toxic. Elaborate and expensive ventilation systems are required to protect personnel subjected to long periods of exposure to processing environments involving use of the acid. Moreover, because of the instability of hydrofluoric acid, etching solutions containing the same tend to have a relatively short life and/or require frequent additions of the acid to maintain useful activity. However, solutions of fluoride salts, such as ammonium bifluoride, are quite stable, extremely active, and require no highly specialized ventilating system for safe usage by workers.

Approximately one-half percent by volume of a compatible "wetting" agent, such as sodium lauryl sulphate, is added to the ammonium bifluoride-sulphuric acid mixture, and all of the components are thoroughly mixed. The inclusion of the "wetting" agent breaks the surface tension of the solution and permits the solution to intimately contact the board, even through very small openings 34B and 36B formed in the copper layes 12B and 16B. The sulphuric acid acts to attack and soften the epoxy so that it may be easily removed by the vapor blast, as previously described.

The mixture is heated in a container 50 which conducts heat well and which is attack-resistant to the solution being heated. By way of example, the container may be made of copper or high density, high temperature linear polyethylene. Alternatively, polypropylene may be used. It can be heated externally by hot water or oil held in a metal, Pyrex, glass or ceramic container to a temperature of approximately 150° F. The board, as shown in FIG. 1(*f*), is then placed into the solution, completely submerging the areas of the material to be removed or dissolved. Non-submerged areas of the work piece are grasped with a clamp-type tool, and the circuit board is constantly moved through the solution in a back and forth manner. Rapid agitation removes dissolved substrate material and spent etchant and exposes new areas of the substrate to new active solution. This agitation, schematically represented in FIG. 3(*a*), is continued for approximately 60 seconds. Then the agitation is stopped, and the work piece is removed and all of the board surfaces that were exposed to the acid mixture are flushed with cold running water, as represented in FIG. 3(b). The board is then passed through jets produced by a pair of vapor blast machines 52 and 52' (FIG. 3(*c*)) which bend the copper layers in the board areas being dissolved. The vapor blast preferably comprises a high pressure liquid containing abrasive particles, such as nut shells, which are directed at the board at substantially a 90° angle. It has been found that one pass of the board past the nozzle at a distance of approximately one inch will suffice to bend the copper of the exemplary 1–3 mil thickness previously mentioned. The vapor blast treatment, of course, also further assists in removing the residual etching acids and bombards the partially or completely dissolved base material, with the resulting outflow of liquid removing the debris and forcing the soft ductile copper areas up against the recently exposed board material surface. The cycle represented by the steps in FIG. 3 is repeated as often as is necessary to produce the desired internal configuration shown in FIG. 2(*d*).

Although a preferred method of practicing the invention has been disclosed in FIG. 3, it is recognized that many variations can be introduced without departing from the spirit or scope of the invention. Thus, for example, the etching solution can merely comprise a sulphuric acid or similar solution for attacking the opoxy, and the vapor blast can be relied on to wash out the exposed glass and softened epoxy.

From the foregoing, it should be appreciated that an improved method for forming holes in circuit boards has been shown herein. It is again pointed out that the term "hole" has been used to represent various types of cutouts and does not necessarily imply a round opening or an opening extending completely through the board. It is also pointed out that, although primary attention has been paid to the utilization of an epoxy and glass board with ammonium bifluoride utilized to etch the glass and sulphuric acid to etch the epoxy, the general techniques disclosed herein are applicable to other board materials. Moreover, although utilization of a "wetting" agent has proved to be very effective where small holes are to be formed, its inclusion is, of course, optional.

Further, although for exemplary reasons the forces applied to the board for bending the copper into the voids left by the dissolved board material have been assumed to be provided by vapor blast machines, such forces can, of course, be provided by other well known means, such as mechanical or ultrasonic devices. The dimensions and percentages disclosed herein, are, of course, exemplary in character, and the teachings of the invention are not to be interpreted as being restricted to elements of any particular size. It is, however, pointed out that if the board is sufficiently thin, the layers of copper on the opposite surfaces of the board can be bent into the opening until they actually engage one another, as shown in FIG. 4, to thereby eliminate the need for plating the hole walls after the steps of FIG. 3 are completed.

The embodiments of the invention in which an exclusive property or privilege is claimed are defined as follows:

1. A method of treating an insulative circuit board including a substrate having conductive material adhered to at least one surface thereof, the conductive material defining at least one opening therein, for forming a hole in said substrate projecting from said one surface and having a conductive hole wall, said method including the steps of:

applying a substance capable of etching said substrate thereto through said opening to thus dissolve said substrate thereat; and simultaneously removing the dissolved substrate material and bending the conductive material into the void left by said dissolved material by directing a force against said substrate around said opening.

2. A method of forming a hole having a conductive wall in an insulative substrate having conductive material deposited on at least one surface around an exposed substrate area, said method including the steps of:

applying a solution to said substrate capable of dissolving said substrate in said exposed area but incapable of substantilly affecting said conductive material; and simultaneously removing the dissolved substrate material and bending the conductive material into the void left by said dissolved material by applying a force to said exposed substrate area.

3. The method of claim 2 wherein said force is in the form of a high pressure liquid carrying abrasive particles.

4. The method of claim 2 wherein said recited steps are alternately performed.

5. A method of forming a hole having a conductive wall in an insulative substrate formed at least partially of glass material and having conductive material deposited on at least one surface around an exposed substrate area, said method including the steps of:

applying a fluoride salt solution to said substrate in said exposed area capable of attacking the glass material therein but incapable of substantially affecting said conductive material; and simultaneously removing the dissolved substrate material and bending the conductive material into the void left by said dissolved material by applying a force to said exposed substrate area.

6. The method of claim 5 wherein said fluoride salt comprises ammonium bifluoride.

7. A method of forming a hole having a conductive wall in an insulative substrate having conductive material deposited on at least one surface around an exposed substrate area, said method including the steps of:

preparing an etchant solution including a wetting agent which solution is capable of dissolving said substrate but incapable of substantially affecting said conductive material;

applying said etchant solution to said exposed substrate area; and simultaneously removing the dissolved substrate material and bending the conductive material into the void left by said dissolved material by applying a force to said exposed substrate area.

8. A method of forming a hole having a conductive wall in an insulative substrate formed at least partially of glass material and having conductive material deposited on at least one surface around an exposed substrate area, said method including the steps of:

preparing an etchant solution including a fluoride salt and a wetting agent which solution is capable of dissolving said substrate but incapable of affecting said conductive material;

applying said etchant solution to said exposed substrate area; and simultaneously removing the dissolved substrate material and bending the conductive material into the void left by said dissolved material by applying a force to said exposed substrate area.

9. A method of forming a hole having a conductive wall and extending between first and second opposed surfaces of an insulative substrate, said first and second surfaces having conductive material thereon and defining aligned openings exposing portions of said substrate, said method including the steps of:

applying a fluoride salt solution to said substrate capable of dissolving said substrate through said openings but incapable of affecting said conductive material; and simultaneously removing dissolved substrate material from both of said openings and bending conductive material on said first and second surfaces into the voids left by said dissolved material by applying oppositely directed forces to said opposed substrate portions.

10. The method of claim 9 wherein said fluoride salt comprises ammonium biflouride.

11. The method of claim 9 wherein said recited steps are alternately performed.

12. The method of claim 9 wherein said forces applied to said board are in the form of high pressure liquid carrying abrasive particles.

13. A method of forming an aperture through a sheet of filled material where at least one surface of said sheet has a layer of material adhered thereto which is chemically different from said sheet, comprising the steps of:

forming a hole in said layer to expose said sheet and then alternating between the steps of;

first, applying a solution to said sheet through said hole, said solution being of a character which chemically attacks said sheet material to at least soften the same while having relatively no effect on said layer of material adhered to said sheet;

second, directing a vapor blast through said hole to remove said softened material; and continuing the alternation between the last two mentioned steps until an aperture is formed through said sheet.

References Cited

UNITED STATES PATENTS

| | | | |
|---|---|---|---|
| 2,118,386 | 5/1938 | Swinehart | 156—24 X |
| 2,889,393 | 6/1959 | Berger | 174—68.5 |
| 2,955,351 | 10/1960 | McCreadie | 174—68.5 X |
| 3,148,310 | 9/1964 | Feldman | 174—68.5 X |
| 3,186,883 | 6/1965 | Frantzen | 174—68.5 |
| 3,264,402 | 8/1966 | Shaheen et al. | 174—68.5 |
| 3,276,106 | 10/1966 | Bester et al. | 174—68.5 |

DARRELL L. CLAY, *Primary Examiner.*